United States Patent [19]
Siala et al.

[11] Patent Number: 5,914,972
[45] Date of Patent: Jun. 22, 1999

[54] THERMAL COMPENSATORS FOR WAVEGUIDE DBR LASER SOURCES

[75] Inventors: Sabeur Siala, Sunnyvale; Steven Sanders, Palo Alto; Mehrdad Ziari, Fremont, all of Calif.

[73] Assignee: SDL, Inc., San Jose, Calif.

[21] Appl. No.: 08/823,096

[22] Filed: Mar. 24, 1997

[51] Int. Cl.$^6$ ........................................ H01S 3/10
[52] U.S. Cl. .............................. 372/33; 372/34; 372/102
[58] Field of Search ........................ 372/102, 33, 34, 372/29, 18, 92

[56] References Cited

U.S. PATENT DOCUMENTS

| | | | |
|---|---|---|---|
| 4,936,646 | 6/1990 | Enochs et al. | 385/52 |
| 5,007,705 | 4/1991 | Morey et al. | 350/96.29 |
| 5,042,898 | 8/1991 | Morey et al. | 385/37 |
| 5,043,991 | 8/1991 | Bradley et al. | 372/32 |
| 5,123,070 | 6/1992 | Bradley | 385/37 |
| 5,159,601 | 10/1992 | Huber | 372/34 |
| 5,317,576 | 5/1994 | Leonberger et al. | 372/6 |
| 5,345,519 | 9/1994 | Lu | 385/12 |
| 5,367,589 | 11/1994 | MacDonald et al. | 385/37 |
| 5,469,520 | 11/1995 | Morey et al. | 385/37 |
| 5,644,584 | 7/1997 | Nam et al. | 372/20 |
| 5,717,804 | 2/1998 | Pan et al. | 385/88 |

OTHER PUBLICATIONS

Yoffe, et al entitled "Passive temperature-compensating package for optical fiber gratings" Oct. 20, 1995, Applied Optics, vol. 34, No. 30, pp. 6859–6861.

Olsson et al, entitled "Performance characteristics of a 1.5 microns single-frequency semiconductor laser with an external waveguide Bragg reflector", Feb., 1988, IEEE, vol. 24, No. 2, pp.143–147.

Morton et al. entitled "Stable single mode hybrid laser with high power and narrow linewidth", Applied Physics, May 16, 1994, vol. 64, No. 20, pp. 2634–2636.

Campbell, et al, entitled "Wavelength stable uncooled fibre grating semiconductor laser for use in an all optical WDM access network", Electronics Letters, Jan. 18, 1996, vol. 32, No. 2, pp. 119–120.

*Primary Examiner*—James W. Davie
*Attorney, Agent, or Firm*—W. Douglas Carothers, Jr.

[57] ABSTRACT

A thermal compensator for stabilization of the operation of a waveguide DBR laser against changes in its operational parameters due to operational temperature changes so that thermally induced longitudinal mode hopping in the laser is suppressed and, in addition, the desired operational wavelength may be stabilized.

20 Claims, 5 Drawing Sheets

THERMAL COMPENSATORS FOR WAVEGUIDE DBR LASER SOURCES

FIELD OF THE INVENTION

This invention relates generally to operational stabilization of waveguide DBR laser sources and more particularly to thermally compensated waveguide DBR laser sources to suppress longitudinal mode hopping.

BACKGROUND OF THE INVENTION

Figure 1:
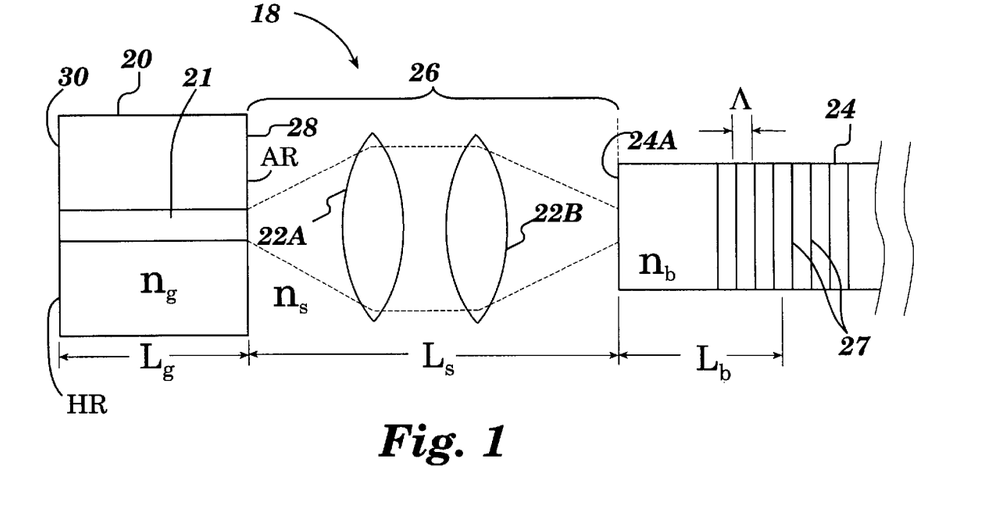
FIG. 1 is a schematic illustration of a waveguide DBR laser source comprising a fiber DBR laser cavity with an lens coupling element.

Single frequency operation of a semiconductor laser can be achieved by employing a hybrid cavity in combination with an external waveguide that includes a Bragg grating. These devices are referred to as waveguide DBR laser sources. FIG. 1 illustrates one such device referred to as a fiber DBR laser comprising a semiconductor laser chip operated as a gain element with its output optically coupled to an optical fiber that includes a fiber Bragg grating. The semiconductor laser chip has an anti-reflective (AR) coating on its front exit facet and a high reflective (HR) coating on its other surface and operates, therefore, as a gain element. Light emitted via the exit facet is focused into the fiber. The fiber grating functions as a partial reflector of a narrow wavelength band reflecting a peak wavelength back into the gain element. The laser cavity is thus defined by the HR facet of the gain element and the grating of the fiber. Examples of fiber DBR lasers are disclosed in the articles of Olsson et al., *IEEE Journal of Quantum Electronics.*, Vol. 24, pages 143–147, 1988, and also by Morton et al., *Applied Physics Letters.*, Vol. 64, pages 2634–2636, 1994.

A fiber DBR laser produces an exceptional single frequency beam because of the narrow bandwidth selectivity of the grating reflective feedback. Since this wavelength of the resonant cavity can be precisely selected by the fiber grating, the fiber DBR laser has become an attractive option for sensing and wavelength division multiplexing (WDM) applications. The fiber Bragg grating is a periodic grating which written within the core of an optical fiber doped with at least one photorefractive element and, upon exposure to UV light via a grating mask, a grating of periodic different refractive index regions is formed in the core of the fiber. Thus, the fiber Bragg grating is a narrow bandwidth wavelength selective partial reflector for forming the resonant cavity while allowing a larger portion of light to pass through and along the fiber as light output.

A fundamental problem arising from employment of a fiber Bragg grating is its sensitivity to temperature changes. With increasing operational or environmental temperature, the fiber length will expand, extending the grating period as well as increasing the refractive index of the fiber. Consequently, the center wavelength of the reflected bandwidth of the fiber grating will be shifted slightly toward a longer wavelength. For a silica fiber this translates to a shift of approximately 0.1 nm for every temperature increase of 10° C. This can be a significant problem for many applications requiring precise wavelength output control. Temperature changes not only shift the operating peak wavelength but also result in a sufficient shift to cause a longitudinal mode hop, i.e., operational wavelength operation from one longitudinal mode to an adjacent mode.

Although these problems resulting from these temperature dependent factors have not been solved for fiber DBR lasers, some progress has been made toward stabilization of the reflected peak wavelength of a fiber Bragg grating. In particular, Morey et al., U.S. Pat. No. 5,042,898, provides a device for mounting a fiber grating under strain. The mounting device is an arrangement of two materials of greatly differing coefficients of thermal expansion. The fiber is mounted via the device in such a way that, as temperature increases, the strain on the fiber decreases. Thus, the thermal expansion and thermally induced refractive index change of the grating are compensated for by the release in fiber strain. In the reference to G. W. Yoffe et al., "Passive Temperature Compensating Package for Optical Fiber Gratings", *Applied Optics,* Vol. 34(30), pp. 6859–6861, Oct. 20, 1995, a thermal compensating package is disclosed which holds the Bragg wavelength of the grating relatively fixed over a temperature range of 120° C., i.e., wavelength stabilization of the grating is addressed. However, compensation in Yoffe et al. is reference only with respect to changes occurring in an optical fiber and there is no disclosure of how to prevent longitudinal mode hopping.

Although it is suggested in the prior art that temperature compensated fiber grating packages may be employed in conjunction with external laser cavities, there is no disclosure as to how this may be effectively accomplished. It is far from obvious how one would use such a device or if such a device as shown in the prior art will work in external cavity lasers. A major problem to resolve is that the various components comprising the fiber DBR laser have different temperature dependent parameters and these parameter variations must also be considered along with the variations in the fiber grating parameters so that the laser, as a whole, can function in a stable manner.

It is the object of the present invention to provide a thermal compensator for a waveguide DBR laser that suppresses mode hopping.

It is another object of this invention to provide a temperature-compensating package that compensates for temperature changes in the laser cavity of a waveguide DBR laser including changes occurring in a semiconductor gain element portion of the cavity.

It is a further object of the invention to provide a package which simultaneously compensates for the changes in the lengths and indices of refraction of the optical fiber, gain element, Bragg grating element and the intervening cavity space of a waveguide DBR laser due to operational temperature changes to stabilize wavelength and suppress longitudinal mode hopping.

SUMMARY OF THE INVENTION

According to this invention, a thermal compensator comprises an optomechanical mounting configuration applied to a waveguide DBR laser source comprising a combination of waveguide attachments comprising a plurality of support members that bridge a portion of the waveguide which may or may not include bridging a Bragg grating element formed in a portion of the waveguide of the waveguide DBR laser source. The waveguide is held under tension while the optical output of the source is monitored for wavelength operation between longitudinal modes of the laser cavity. The compensator is fixed in position on the waveguide bridging the waveguide portion while maintaining the waveguide under tension to achieve a set point of operational wavelength between adjacent longitudinal modes of its laser cavity. As the environmental and operational temperature of the waveguide DBR laser source increases or decreases, the optical path length as a function of refractive index, n, and optical cavity length, L, slightly increases or decreases while, correspondingly, the thermal compensator decreases in effective length decreasing or increasing, respectively, the pre-set tension of the waveguide thereby maintaining the set wavelength of operation and preventing occurrence of longitudinal mode hopping. The materials comprising the compensator components, referred to herein as support members, are selected such that they expand and contract in a manner that respectively reduces or increases the pre-set tension on the bridged waveguide portion. As a result, the effective length of the waveguide optical path length is substantially maintained as pre-set so as to prevent the optical path length to become significantly changed inducing a different longitudinal mode of operation, i.e., a mode hop, resulting in a substantially different reflected peak wavelength operational wavelength for the laser source.

In contrast to the previously discussed prior art, the thermal compensator of this invention is designed to thermally stabilize the entire waveguide DBR laser source over an operational temperature range and not just stabilization of the Bragg grating period of the fiber grating over an operational temperature range, which, for example, is the specific aim of Yoffe et al., supra.

In one embodiment of the invention, longitudinal mode hopping suppression is achieved, without regard for any slight changes in operational wavelength, by taking into consideration the compensation of optical path length changes in external cavity portion of the waveguide DBR laser source comprising a fiber DBR laser comprising a compound cavity that includes a spatially, optically aligned gain element and optical fiber with a Bragg fiber grating. To this end, a thermal compensator package comprises a first support member having a low coefficient of thermal expansion, such as, for example, made of silica, and at least one second support member having a significantly higher coefficient of thermal expansion, such as, for example, made of aluminum. These two support members are secured together at one end and their other ends are secured to spatially separated points along the fiber portion between its input end and a formed Bragg fiber grating. The spatially bridged fiber portion of the fiber cavity is held under tension by the fiber support members, i.e., the fiber is held under tension before the final attachment of the mentioned other ends of the support members directly to the fiber surface. The two support members are connected in a manner so that, with an increase in operational temperature, the tension on the fiber will be proportionately released as the temperature increase causes the fiber to extend. A mathematical approach is disclosed laying the ground work for choosing appropriate materials of desired coefficient of thermal expansion characteristics to match those of the waveguide so that thermally induced expansion or contraction of the waveguide, changing the effective optical path length of the laser cavity is compensated for by the thermal compensator suppressing longitudinal mode hopping.

Another embodiment of the invention takes into consideration concurrent stabilization of operational wavelength as well as mode hopping with a thermal compensator comprising plural waveguide attachments. One portion of the compensator provides for a decrease in the gap length, $L_s$, between the gain element and the input end of the waveguide with increasing temperature. Another portion of the compensator provides for a slight decrease in the optical path length and, hence, a slight shortening of the fiber grating. Although changes of the gap length and the waveguide grating period both decrease with increasing temperature, their respective rates of decrease differ. A mathematical approach is disclosed laying the ground work for choosing appropriate materials of desired coefficient of thermal expansion characteristics the multi-component attachment of the compensator takes into consideration these different rates to stabilize wavelength concurrently with suppression of longitudinal mode hopping.

As used in this application, the term "waveguide", such as, for example, as used in "waveguide DBR laser", is reference to a class of light waveguides that comprises both (1) optical fibers (fiber waveguides) having circular, elliptical, rectangular or other polygonal cross-sectional core/cladding configurations, as known in the art, and (2) planar waveguides having channel or buried light waveguides made of material capable of waveguiding light, such as those comprised of silica as well as highly applicable to planar structures such as silicon microbenches or ceramic optical microbenches. For the purposes of illustration of the invention, however, reference will be made to a fiber DBR laser source.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS OF THE INVENTION

Figure 2:
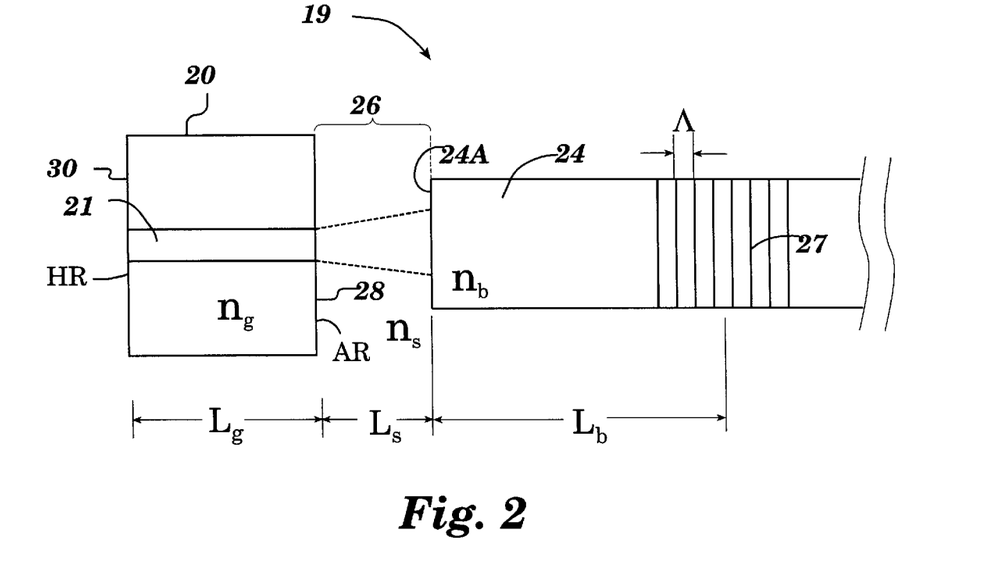
FIG. 2 is the same waveguide DBR laser source of FIG. 1 except having a butt coupling to the fiber.

The exemplary embodiments of the thermal compensator comprising this invention are shown as applied to waveguide DBR laser sources employing a fiber waveguide as the external cavity medium forming fiber DBR laser source. However, the principals of this invention may also be applied to planar type of optical waveguides, as can be understood by those skilled in the art. A plan view of fiber DBR laser sources 18 are illustrated in FIGS. 1 and 2. In FIG. 1, fiber DBR laser source 18 comprises gain element 20, optical coupling elements 22A and 22B, and fiber 24 for receiving the light output from exit facet 28 of gain element 20 via optical coupling element 22 in an input end of fiber 24. Fiber 24 includes a Bragg grating 27 that is formed in the fiber by conventional means known in the art, such as photorefractively by UV light exposure where the fiber doped with material sensitive to UV light.

Gain element 20 has a length, $L_g$, and index of refraction, $n_g$. gain element 21 includes a pumping strip 21 for pumping the gain element to produce stimulated emission. Exit facet 28 of gain element 20 is AR coated so that it has very low reflectivity while rear facet 30 is of high reflectance (HR). No internally reflected feedback is desired from facet 28 back into gain element 20 so that the reflectivity level of facet is reduced as much as possible and generally is below 0.1%. Another approach to eliminating any such feedback is to provide a curved portion in the portion of stripe 21 (not shown) near the front exit facet 28 so that reflected light, upon reflection, is directed into non-pumped regions of gain element 20 and is absorbed. See, for example, the article of R. J. Campbell et al. entitled, "Wavelength Stable Uncooled Fibre Grating Semiconductor laser For Use in an All Optical WDM Access Network", *ELECTRONIC LETTERS,* Vol. 32(2), pp. 119–120 (Jan. 18, 1996), incorporated herein by its reference, a grating provided a peak reflectivity of 24% and a bandwidth of 0.2 nm for a total gain element/fiber resonant cavity length of about 1 cm which corresponded to a free spectral range of 0.05 nm, compared to the case where no angled pump stripe portion was utilized which was about 0.6 nm. This fiber DBR source reportedly maintained single frequency operation over the temperature range of 15° C. to 45° C. except there was still regions of mode hopping. It was recognized that laser mode hops cannot be avoided over such a temperature operating range without some kind of temperature control.

Optical coupling element 22 is in axial alignment between gain element 20 and fiber input end 24A in gap 26, and has an index of refraction, $n_s$, and length, $L_s$. Fiber 24 has an index of refraction, $n_b$, effective length, $L_b$, between the end of the fiber and grating 27, which has a grating period of $\Lambda$. The optical cavity of source 18, therefore, comprises the combined optical cavity lengths, $n_g L_g + n_s L_s + n_b L_b$, (see equation (3), infra) extending from HR facet 30 of gain element 20 to effective fiber grating reflector 27.

As previously indicated, fiber Bragg grating 27 is employed in this embodiment although it will be appreciated that fiber 24 may be a planar waveguide device, such as made of silica, with a Bragg grating formed in the silica waveguide or may be a in a material such as $LiNbO_3$.

Gain element 20 may be made of one of any number of lasing materials such as Group III-V materials. An example of a suitable gain element is a semiconductor chip made from material regimes such as InGaAsP/InP, InGaAs/GaAs and AlGaAs/GaAs. It should also be noted that gain element 20 may be a fiber gain medium doped or co-doped with rare earth elements, such as Er, Nd and Yb or Er:Yb. Optical coupling element 22 illustrated in FIG. 1 is a conventional coupling lens system comprising a first lens to collimate the gain element light output and a second lens to focus the collimated beam into the core of fiber 24. The lens system shown is especially effective in NA matching with the fiber core of the gain element output light. Also, improved NA matching in the transverse or fast axis direction of the gain element output light may be accomplished with a cylindrical lens (not shown) positioned between exit facet 28 of gain element 20 and lens 22A, as is known in the art.

In fiber DBR laser source 19 in FIG. 2, the coupling of gain element output light is achieved by means of butt coupling where the laser NA output is substantially matched with the fiber core NA input so that no optical lens is employed. In this embodiment, the laser exit facet 28 is in close proximity to input end 24A of fiber 20. Also, as know in the art, the input end 24A of fiber 24 may be formed into a lens configuration for more efficient light input such as a conical-like lens, a concave or convex semi-cylindrical lens formed in or on, respectively, fiber end 24A, or a wedged-shaped lens.

A fiber Bragg grating has a property that permits reflection of light in a narrow band about a free-space wavelength according to, $$\lambda_b = 2 n_b \Lambda, \quad (1)$$

where $\Lambda$ is the period of the grating $n_b$ is the average effective refractive index of the fiber. This makes a fiber Bragg grating especially suitable as a feedback reflector in a formed resonant cavity with gain element 20 at or close to wavelength $2 n_b \Lambda$.

The output of fiber DBR laser sources 18 or 19 is beyond grating 27. Although grating 27 reflects a small portion of light back into the resonant cavity, a substantial portion of the light is transmitted through the grating.

Fiber DBR laser sources 18 or 19 lase in a defined longitudinal mode, m, at a single free-space wavelength $\lambda$ satisfying, $$L = \frac{m\lambda}{2}, \quad (2)$$

where L is the optical path length, $$L = L_g n_g + L_s n_s + L_b n_b. \quad (3)$$

Equation (2) is a quantization condition stating that an integer multiply m of half-wavelengths fit into the optical path length of the cavity including gain element length, $L_g$, spacing, $L_s$, and fiber cavity length $L_b$. The value for $L_s$ is indicated as the remaining spacing between $L_g$ and $L_b$. The above equation (3) relates to a single spacing segment, $L_s$. If, however, an embodiment includes more than one spacing segments along the optical axis, such as two or more spatially disposed spacing segments in axial alignment with a gain element, then equation (3) would take into account these multiple segments in the total cavity length, L, as given by, $$L = L_g n_g + \sum_i L_{si} n_{si} + L_b n_b. \quad (3A)$$

For optimal performance, it is desirable that the free-space wavelength, $\lambda_b$, reflected by Bragg grating 27 substantially matches the free-space wavelength $\lambda$ of the resonant cavity, i.e., $\lambda_b \approx \lambda$. When a fiber DBR laser source lases in the longitudinal $m^{th}$ mode jumps to another mode number, n, such that n≠m, a mode hop is said to have occurred. Longitudinal mode hopping is commonly induced by small fluctuations in operational parameters such as those perhaps induced by changes in the environment, particularly temperature variations. When steady laser output is desired, as often is the case, longitudinal mode hopping can increase system noise and power output fluctuations. We have discovered an approach to stabilize the operation of fiber DBR lasers, such as those shown in FIGS. 1 and 2, against mode hopping induced by temperature variations. Changes in temperature can disrupt the relationship (2), inducing longitudinal mode hopping. This is because, in general, the lengths $L_g$, $L_s$, $L_b$ will change with temperature as will their effective refractive indices, $n_g$, $n_s$, $n_b$. In addition, since the length $L_b$ of grating 27 changes, so does its grating period, $\Lambda$, resulting in changes in the feedback wavelength sufficient to induce mode hopping. With appropriate mounting of compensators in fiber DBR laser sources 18 or 19, temperature induced changes can be effectively compensated for so that modal operation remains in the pre-selected $m^{th}$ mode. The mathematical motivation for the invention is as follows.

Compensator Motivation

Equation (2) can be rewritten as, $$\frac{2\pi}{\lambda} 2L = 2\pi m. \tag{4}$$

For small temperature variations, the mode, m, is to remain stable, i.e., the same. Hence, a variation of relationship (2) with respect to temperature with the mode, m, fixed is described as follows:

$$\frac{dm}{dT} = \frac{2}{\lambda}\left[\frac{dL}{dT} - \frac{L}{\lambda}\frac{d\lambda}{dT}\right]. \tag{5}$$

Here, the chain rule of differentiation applied to equation (3) yields, $$\frac{dL}{dT} = n_g L_g C_g + n_s L_s C_s + n_b L_b C_b, \tag{6}$$

where $$C_g = \left[\frac{1}{L_g}\frac{dL_g}{dT} + \frac{1}{n_g}\frac{dn_g}{dT}\right], \tag{7}$$

$$C_s = \left[\frac{1}{L_s}\frac{dL_s}{dT} + \frac{1}{n_s}\frac{dn_s}{dT}\right], \tag{8}$$

$$C_b = \left[\frac{1}{L_b}\frac{dL_b}{dT} + \frac{1}{n_b}\frac{dn_b}{dT}\right]. \tag{9}$$

Since the wavelength reflected by Bragg grating 27 also varies with temperature, the following results are achieved with differentiation of equation (1):

$$\frac{d\lambda}{dT} = 2n_b\frac{d\Lambda}{dT} + 2\Lambda\frac{dn_b}{dT}, \tag{10}$$

where, $\lambda_b$ is set equal to $\lambda$.

In cases of additional spacing segments, as mentioned above, where two or more spatially disposed spacing segments are in axial alignment with a gain element, then equation (3) would take into account these multiple segments in the total cavity length, L, as given by, $$\frac{dL}{dT} = n_g L_g C_g + \sum_i n_{si} L_{si} C_{si} + n_b L_b C_b \tag{6A}$$

A principal feature of this invention is the placing the fiber portion of the fiber DBR laser source under a small amount of tension, i.e., the fiber is placed and maintained in a stretched state. With a uniformly applied stretching of fiber grating 27 the grating periods uniformly stretched so that $$\frac{d\Lambda}{\Lambda} = \frac{dL_b}{L_b}.$$

Hence, the above equation (10) can be rewritten as $$\frac{d\lambda}{dT} = \lambda C_b, \tag{11}$$

where, in addition, equation (1) has been incorporated. By combining equations (11), (6)–(9), and setting $$\frac{dm}{dT} = 0,$$

the following is yielded:

$$n_g L_g C_g + n_s L_s C_s - (n_g L_g + n_s L_s)C_b = 0, \tag{12}$$

Equation (12) is the primary guide to constructing thermal compensator packages for waveguide DBR laser sources comprising this invention resisting longitudinal mode hopping under temperature variations. Packages which approximate equation (12) will ensure that the desired mode, m, remains the same.

In constructing packages for fiber DBR laser sources 18, 19 satisfying (12), it is noted that coefficients $C_s$ and $C_b$ can be set by packaging considerations in the utilization of this invention, while coefficient $C_g$ is predetermined or set by the chosen gain element 20. This is accomplished with the proper choice of materials comprising the compensator with properly selected thermal expansion coefficients and properly selected lengths for the components. Coefficient $C_s$, and in some cases the coefficient $C_b$ depending upon the design approach, are adjusted via a thermal compensating component or components comprising the compensator package of this invention wherein the fiber lengths relative to both or one of these coefficients are or is held under pre-set tension, and thermal expansion or contraction of the compensating component or components permit compensation in substantially linear fashion with temperature variations. Therefore, this invention permit freedom in setting the coefficient $C_s$ or the coefficients $C_s$ and $C_b$ to substantially minimize any possibility of longitudinal mode hopping. The coefficient $C_g$ need not be considered in the providing a sufficiently accurate thermal compensating effect. However, it should be understood that temperature compensation of gain element 20, such as through a separate Peltier cooler or a heater, as is known in the art, can be employed in combination with the thermal compensator of this invention.

Embodiments

A. Mode Hop Suppression

Figure 3:
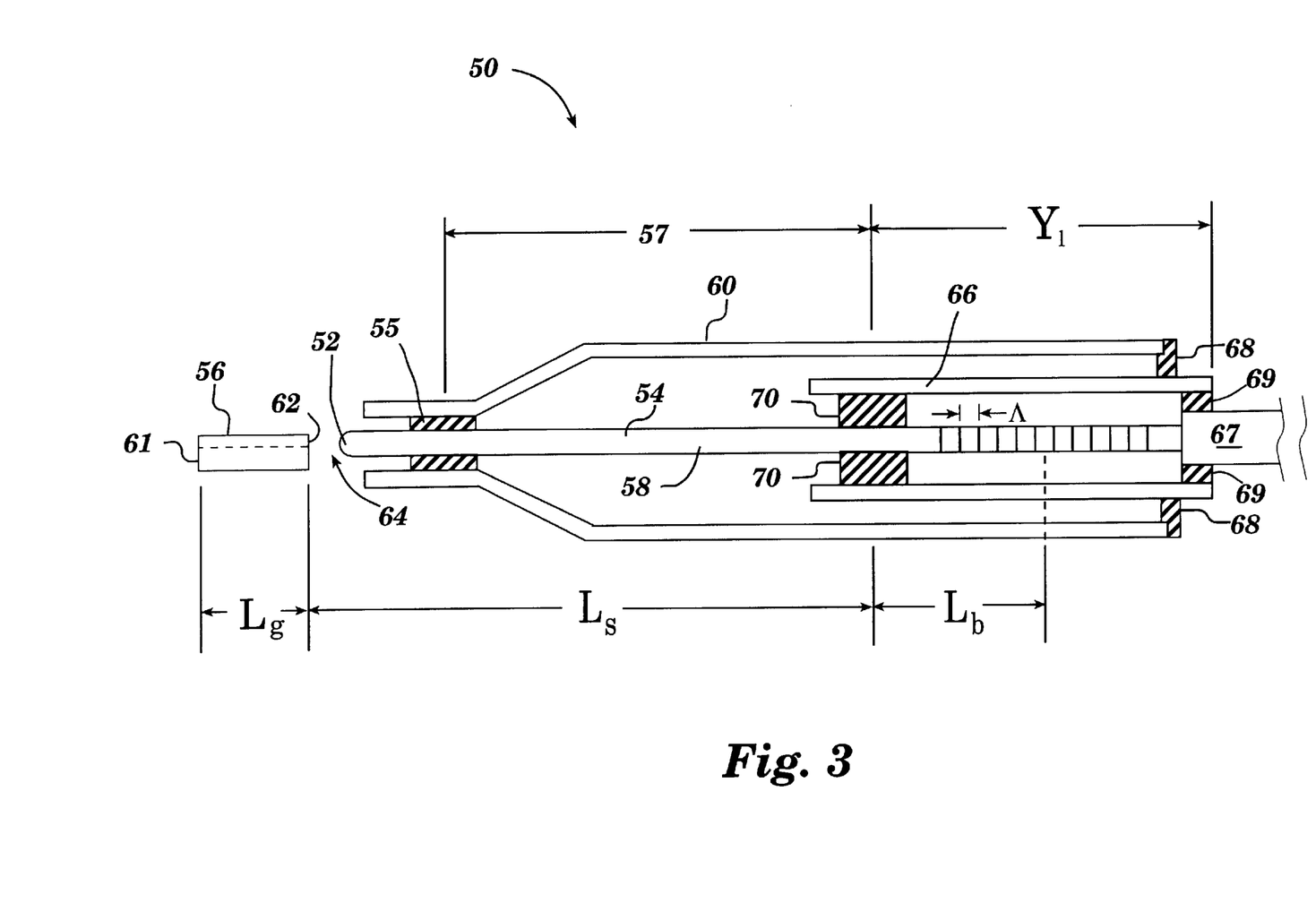
FIG. 3 is a schematic illustration of a thermal compensator according to a first embodiment of this invention.

Reference is now made to an embodiment of this invention with respect to FIG. 3 that involves thermal compensation relative to suppression of longitudinal mode hopping under changing temperature conditions. This condition is achieved if the following equation (13) is satisfied:

$$\frac{dm}{dT} = 0, \tag{13}$$

A useful thermal compensator package is one which controls coefficient $C_s$ and length $L_s$ to compensate for changes in the total spatial cavity length of the laser source and, correspondingly, its operational peak wavelength. FIG. 3 illustrates a first embodiment of a thermal compensator 50 comprising this invention dealing with coefficient $C_s$ or length $L_s$. In FIG. 3, a fiber DBR laser source comprises semiconductor gain element 56 having rear HR facet 61 and front exit AR facet 62 of length, $L_g$, coupled to optical fiber 58 having a lensed tip 52 for receiving output light from laser facet 62, via spacing 64, and coupling the light into fiber 58. Fiber 58 includes grating 54 which, together with a very small portion of fiber 58, has an effective length, $L_b$, as indicated in FIG. 3. It should be noted that change in Lb and Nb with temperature is substantially cancelled by the changes in the grating period, so no fiber grating section is included in the compensated portion of the cavity segment, $L_s$, although the operational wavelength may change a small amount.

Fiber 58 also has a protective jacket 67 that is removed for the purpose of forming lens 52 and grating 54 as well as permitting sufficient space to mount thermal compensator 50 on the fiber as supported from its outer jacket 67. Thermal compensator 50 comprises two support members 60 and 66 having different thermal coefficients of expansion. As can be seen from FIG. 3, support members 60, 66 are attached together in proximity to one of their ends at 68. The other end of support member 60 extends toward gain element 56 and is attached at 55 directly to fiber 58 in close proximity to the fiber input, lensed end 52. The other end of support member 66 is capable of insertion within the support member 60 and also extends toward gain element 56 and is attached directly to fiber at 70, which is positioned between grating 54 and fiber end 52 such that most of the length, $L_s$, is under compensating affect (spacing 64 is so small as to be consider negligible). The furthest most end of support member 66 away from gain element 56 is attached to fiber 58 at its outer protective jacket 67 as indicated at 69. In summary, then, a portion of the length of fiber 58 that is a substantial part of the fiber DBR laser resonant cavity, not including grating 54 is embraced by two bridging support members 60, 66 that are connected together and supported from the fiber jacket 67 or other suitable support member connected to fiber 58. Importantly, support members 60, 66 are characterized by having different thermal coefficients of expansion, support member 60 having a low coefficient of thermal expansion (considered negligible in connection with this invention) and support member 66 having a significantly higher coefficient of thermal expansion to provide the desired thermal compensating effect brought about by compensator 50 of this invention. Alternatively, it should be noted that in the construction of compensator 50, it may desired, in certain cases, to provide support member 60 to have a higher coefficient of thermal expansion with support member 66 having a low thermal coefficient of expansion.

Fiber portion 57 is mounted under a state of tension during laser operation so that the spectral output characteristics of the laser source can be examined to determine the spectral location of longitudinal modes of operation. With the fiber held under tension, one of the modes, m, is selected as the peak operational wavelength of the laser source. Fiber portion 57 will vary in length and effective refractive index with temperature according to its predetermined coefficient of thermal expansion. Also, correspondingly, the operational wavelength, λ, will also vary. However, since spacing 64 varies fairly uniformly with changes in temperature, then coefficient $C_s$ can be adjusted to compensate and ensure that equation (12) is satisfied so that the laser source remains in the selected m mode of operation. Thus, the thermal compensator of this invention is particularly useful for controlling a pre-set laser operational longitudinal mode, m, to be a determined controllable function with temperature variation so that the possibility of mode hopping is minimized on a continuous basis.

To accomplish the foregoing goals, coefficients $C_g$ and $C_b$ are calculated for a specific case of selected gain element 56 and fiber 58. Then, a thermal compensator package is designed to provide the derived expansion rate. As an example, gain element 56, which is a semiconductor gain chip, may have the values $n_g$=3.2 and $$L_g = 0.25 \text{ mm}, \frac{dn_g}{dT} = 4.2 \times 10^{-4} /° \text{C., and } \frac{1}{L_g} \frac{dL_g}{dT} = 4.6 \times 10^{-6} /° \text{C.}$$

With these values, the coefficient for the gain element contribution to equation (7) is $C_g$=1.36×10$^{-4}$/°C. Grating 27 is generally in a silica fiber. For a typical operational wavelength λ=1550 nm, grating 27 will have an effective index value of $n_b$=1.5 and its fiber length from input end 24A to grating 27 is $$\frac{1}{n_b} \frac{dn_b}{dT} = 7.0 \times 10^{-6} /° \text{C. and } \frac{1}{L_b} \frac{dL_b}{dT} = 5 \times 10^{-7} /° \text{C.}$$

With these values, the coefficient for the fiber grating is $C_b$=7.5×10$^{-6}$/°C.

It should be noted that the value above for $C_b$ is just the coefficient of linear expansion for silica. As one skilled in the art will recognize, the values for $n_g$, $L_g$, $n_b$, $L_b$, as well as the values for $$\frac{dn_g}{dT}, \frac{1}{L_g}\frac{dL_g}{dT}, \frac{1}{n_b}\frac{dn_b}{dT}, \text{ and } \frac{1}{L_b}\frac{dL_b}{dT}$$

are typical examples. Further, different values, of course, will arise in other embodiments which are within the scope of this invention; in particular, one would expect the lengths $L_g$ and $L_b$ to vary substantially among applications depending of the gain element selected and the type of fiber or waveguide and its chosen length.

It should be noted that in the FIG. 3 embodiment as well as in subsequent embodiments to be discussed, the fixing positions of support members 60 and 66 to one another as well as their fixing positions to fiber 58 are considered as effective points of connections (as opposed to connection lengths), as indicated by the defined distances $Y_1$, $L_s$ and $L_b$ in FIG. 3, which is an assumption that is also carried into the mathematical support for this invention. Moreover, the design of the FIG. 3 embodiment minimizes relative movement or misalignment of the lens end 52 of fiber 58 relative to gain element 56 as the temperature varies so as to keep the coupling efficiency optimized.

Reference is now made to a possible procedure for fixing of compensator 50 to fiber 58. Other approaches for attachment of the support members of the compensator to the fiber DBR laser are obviously possible. First, support member 66 is first attached to jacket 67 at point 69. Support member 66 is then fixed to fiber 58 at point 70. Then, support member 60 is fixed to fiber 58 at point 55. Then using an alignment mechanism, such as a microbench or other such optical platform or device, input end 52 of fiber 58 is optically aligned with gain element 56 to receive its light output. Then, as gain element is operated and the output spectrum from an output end of fiber 58 is monitored, fiber 58 is placed under tension, i.e., is held in a stretched state, between points 55 and 70. With gain element 56 operating, the spectral characteristics of the output from fiber 58 are observed to determine the longitudinal mode properties of the fiber DBR laser. Then, while still observing these spectral characteristics, a desired operational wavelength for the fiber DBR laser is established by adjusting the applied tension on fiber 58 between points 55 and 70. Once a desired inter-spatial mode set point has been established, support member 60 is attached to support member 66 at point 68. Once this last fixing point 68 is completed, then compensator 50, as fixed to fiber 58, may be also fixed in place in an appropriate package with properly maintained alignment with gain element 56. Thus, it can be seen, that fiber 58 is held under predetermined tension and is fixed in this state by support members 60, 66 bridging grating 54. If, during operation of the fiber DBR laser the temperature, for example, increases, fiber 58, bridged between joints 55 and 70, will also expand with temperature according to its rate of thermal expansion. On the other hand, support member 15 has a comparatively low rate of thermal expansion so that its expansion will be minimal. However, the rate of thermal expansion of support member 66 will be significantly larger and its expansion will counteract the expansion of support member 60 so as to relieve the tension on fiber 58 in a manner, according to the previous discussion and equations, will relieve the pre-set tension of the fiber so that the increase in fiber length comprising that portion of the fiber that is part of the resonant cavity of the fiber DBR laser is compensated for, i.e., the original pre-set length value for $L_b$ of the fiber under tension is maintained with changing operational temperature. This is because support member 66 thermal expands toward gain element 56 with increasing temperature, proportionately relieving the preset tension on fiber 58 between joints 55 and 70.

In compensator 50, the selection of the material with high coefficient of thermal expansion for support member 66 dictates what the lengths that will need to be established for the values of $L_s$ and $Y_1$ according to the foregoing mathematical analysis. As an example, if a alumina (96% $Al_2O_3$) is chosen, its coefficient of thermal expansion value for K is $7 \times 10^{-6}/°C$., then if, for example, the value for $L_s$ is 5 mm, then the value for $Y_1$ will be 9.4 mm. This requires a stretching of the fiber length 57 by about 6.4 $\mu$m yielding a relative stretch of 0.08%, which is well below the maximum safe long term tensional strain of standard telecommunications glass fibers which maximum is estimated to be approximately 0.5%.

Figure 4:
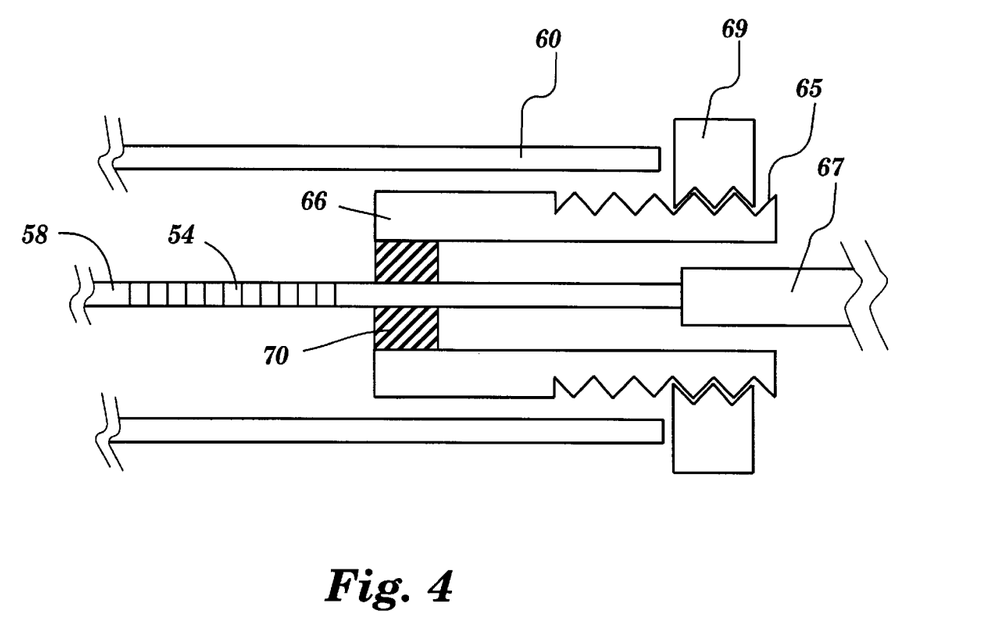
FIG. 4 is a schematic illustration of means for adjusting the tension applied to a mounted fiber in the embodiment shown in FIG. 3.

A convenient way for adjusting the pre-set tension of fiber 58 between the set points 55 and 70 may accomplished on a manner illustrated in FIG. 4. As shown in FIG. 4, instead of employing a fixed attachment point at 68 (FIG. 3), the outer end of support member 66 is threaded, as shown at 65, to receive a nut member 69 in rotational engagement so that, upon rotation, nut 69 will tighten against the outer end of support member 60 which is fixed to fiber 58 at point 55. Thus, the tension of fiber 58 including grating 54 between set points 55 and 70 can be adjusted by turning nut 69 while observing the output of the fiber DBR laser source to adjust for operational wavelength and, more importantly, positioning of modal operation so as to be at a selected mode number. The tension adjusting mechanism of FIG. 4 may also be applied to other embodiments of this invention.

It should be noted that the physical geometry of support members 60, 66 may be of different configurations. Since the fiber 58 is a cylindrical shaped member, one of the most natural geometries is a tubular shape geometry, e.g., of circular cross section (such as cylindrical shaped), triangular cross section or square cross section, although any other type of geometry may be chosen and will perform the function. For example, support members 60, 66 be two or more may spaced longitudinal bars or strips of material fixed together at opposite ends. Therefore, the particular geometry chosen is not necessary so important to the invention as is the thermal expansion coefficient of the material employed for the member as well as the resulting thermal expansion. Also, the attachment points in package 50, such as set points 55, 68, 69 and 70 may be any suitable material that securely fastens these different material components together. Examples of such securing materials are epoxy, welding, glass frits, precision screws relative members 60 and 66, or solder, the latter employed where the outer surface of fiber 58 and the inner edge surface of base support member 60 have been appropriately metallized.

In order to provide contraction or reduction of the optical cavity length, L, inner support member 66 of a high coefficient of thermal expansion may be mounted in a concentric manner within outer support member 60. Inner support member 66 is most suitably made from a material of higher thermal expansion than support member 60, such as, for example, alumina which has a coefficient of thermal expansion of $K = 7 \times 10^{-6}/°C$. However, other materials may be easily employed in the practice of this invention. The length of inner support member 66 has an effective length, $Y_1$. Outer support member 60 has a very low rate of thermal expansion so that it functions as the mainstay member for thermal expansion and contraction occurring with changing temperature relative to member 66 and fiber portion 57 held under tension. The rate of change with temperature of the two lengths, $L_s$ and $Y_1$, in FIG. 3 are equal but opposite (spacing 64 consider negligible).

It will be recalled that fiber portion 57 is held under tension so that it is allowed to expand and contract with temperature fluctuations as part of the overall change and compensation for change in values of nL. Therefore, thermal compensator device 50 could be operated as a tunable device by controlling the temperature of the cavity. The rate of change of wavelength $\lambda$ with temperature is given by equation (11) and depends only upon the parameters of the grating 54. The rate of change of wavelength could be adjusted by thermal stability applied to fiber 58 such as with the employment of a heater to maintain the optical cavity of the laser at a predetermined operating temperature.

B. Mode Hop Suppression With Wavelength Stabilization

Figure 5:
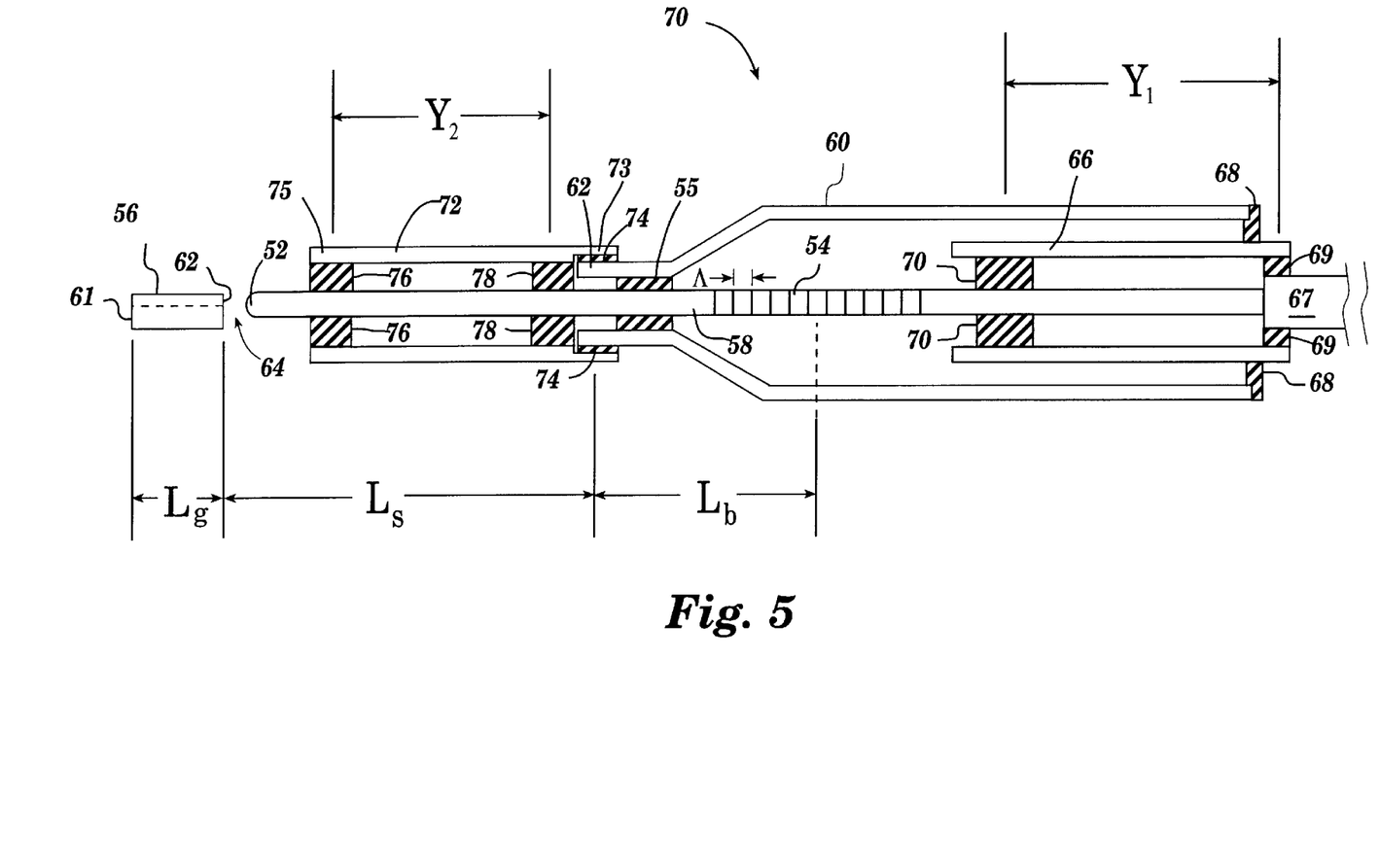
FIG. 5 is a schematic illustration of a thermal compensator according to a second embodiment of this invention.

Reference is now made to another embodiment of this invention with respect to FIG. 5 that involves not only thermal compensation relative to suppression of longitudinal mode hopping but also takes into consideration wavelength stabilization under changing temperature conditions. This condition is achieved if both of the following equations are simultaneously satisfied:

$$\frac{d\lambda}{dT} = 0; \frac{dm}{dT} = 0, \tag{14}$$

For waveguide DBR laser sources, such as those illustrated herein, this condition insures that the output laser light is wavelength is stable. The condition of equations (14) leads to $$\frac{d\lambda_b}{dT} = 0.$$

Upon review of equations (9) and (11), it can be seen that equation (14) corresponds to the case where $C_b=0$ so that equation (9) can be reduced to, $$n_g L_g C_g + n_s L_s C_s = 0. \quad (15)$$

The requirement of $C_b=0$ implies that length, $L_b$, of the fiber grating should satisfy, $$\frac{1}{L_b}\frac{dL_b}{dT} = -\frac{1}{n_b}\frac{dn_b}{dT} = -7.0 \times 10^{-6}/°C., \quad (16)$$

where numerical value above in (16) is for a fiber grating comprising silica.

FIG. 5 discloses a thermal compensator package 70 comprising a second embodiment of this invention accomplishes the desired rates of length changes for both $$L_s \left( \frac{1}{L_s} \frac{dL_s}{dT} \right) \text{ and } L_b \left( \frac{1}{L_b} \frac{dL_b}{dT} \right).$$

As previously indicated, these rates of change are different and, therefore, require separate components of different thermal expansion rates independently matched to these separate rates. Package 70 comprises the same fiber DBR laser and laser cavity as set forth in the embodiment of FIG. 3 so that like components carry the same numerical identification and, having been previously discussed, will not be further discussed here. Likewise support members 60 and 66 and their attachment to fiber 58 is fabricated to bridge fiber grating 54 in the same manner as previously discussed in connection with the embodiment of FIG. 3. However, FIG. 5 differs primarily with an additional or third fiber support member 72, having a predetermined length, $Y_2$, attached at its one end 73 to the forward end 62 of low thermal expansion support member 60 at point 74. The other end 75 of member 72 is attached directly to fiber 58 adjacent its input end 52 at point 76. Like support member 66, support member 72 is comprised of high thermal expansion material so that both members 66 and 72 expand and contract at rates with appropriate lengths, $Y_1$ and $Y_2$, set to the requirements of the foregoing equations (8) and (9) relative to thermal expansion characteristics of the components comprising the DBR laser cavity, i.e., gain element 56, spacing 64, and fiber 58 from input end 52 to set point 70. Thus, support members 66 and 72 are mounted with respect low thermal expansion member 60 so that their respective lengths, $L_s$ and $L_b$, will increase with increasing temperature or decrease with decreasing temperature. However, with fiber 58 initially held under preset tension to operate at wavelength $\lambda_0$, between respective set points 76 and 78 of support member 72 and, also, between respective set points 55 and 70 of support member 66, any increase, for example, in operational temperature will effectively decrease the tension on fiber 58 between set points 55 and 70 (i.e., the length, $Y_1$, increases and, therefore, effectively decreasing DBR cavity length between points 55 and 70) to suppress the possibility of any change in operational longitudinal mode to another mode, while correspondingly increasing the tension between set points 76 and 78 (i.e., the length $Y_2$ increases and, therefore, effectively increasing DBR cavity length between points 76 and 78) to effectively maintain the wavelength at the operating wavelength, $\lambda_0$.

Additional support member 72, like support member 66, is most suitably made from a material of higher thermal expansion, such as stainless steel, aluminum, copper alloy or the like. However, other metals or materials of high thermal expansion may be easily employed in the practice of this invention.

As an example of the utilization of this invention with respect to compensator package 70, if the values chosen for the length, $L_s$, in FIG. 5 is approximately 6 m m and the value for length, $Y_2$, is approximately 4.9 mm, because of package requirements, for example, then, the material for support member 72 needs to be about $K=23.4\times10^{-6}/°C$. according to the foregoing equations. A check of known K values for various materials reveals that aluminum has a coefficient of thermal expansion of approximately $K=23.6\times10^{-6}/°C.$[1], which is sufficiently close to the needed value for the given lengths of $L_s$ and $Y_2$. In the case of the lengths for $L_b$ and $Y_1$, these lengths are chosen so that $$\frac{dL_b}{dT} \cong -KY_1.$$

If we select CuW of a ratio of 15%/85%, which has a coefficient of thermal expansion of approximately $K=7\times10^{-6}/°C.$, to be the material for support member 66, then, lengths $Y_1=L_b=7$ mm satisfy the compensation requirements as outlined above.

As in the embodiment of FIG. 3, the attachment points in package 70, such as set points 55, 68, 69, 70, 76 and 78 may be any suitable material that securely fastens these different material components together. Examples of such securing materials are epoxy, welding, glass frits, precision screws relative members 60, 66 and 72, or solder, the latter employed where the outer surface of fiber 58 and the inner edge surface of base support member 60 have been appropriately metallized.

In general, median space 64 is set so that acceptable coupling efficiency of light from gain element 56 is achieved, and the fiber portion containing grating 54 is mounted so that temperature variations produce controlled expansions or contractions of the length of this element so that mode hopping can be suppressed. In fact, for example, by reversing the mounting of support member 66 with respect to base support member 60, i.e., extending outward way from member 60 to the left in FIG. 5, grating 54 will be stretched with increasing temperature in a controlled manner, if desired. It should be appreciated that in either of the embodiments of FIG. 3 or FIG. 5, the fiber is mounted under pre-set tension for the purpose of suppressing mode hopping or combination of mode hopping suppression and wavelength shift correction which are designed to stabilize the laser in contrast to the prior art, such as disclosed in Yoffe et al. which are purely designed for stabilization of the grating, i.e., to maintain the same grating period, $\Lambda$, of the fiber grating over a range of temperature variation.

Figure 6:
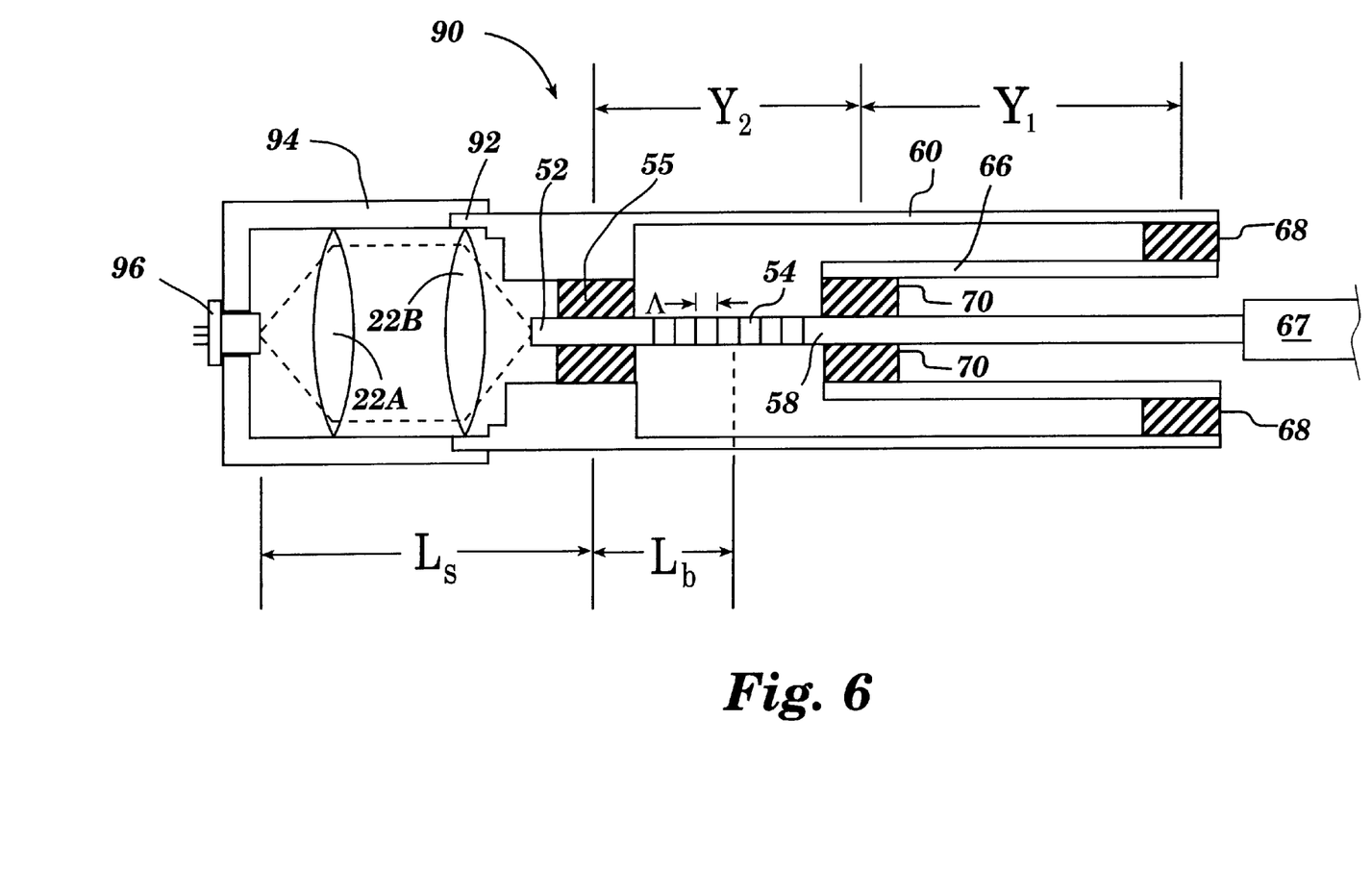
FIG. 6 is a schematic illustration of a thermal compensator according to a third embodiment of this invention.

Reference is now made to FIG. 6 which is another embodiment comprising thermal compensator 90, which is similar to the embodiment of FIG. 3 except utilizing the coupling scheme between the gain element and fiber input end as shown in FIG. 1. In FIG. 6, as explained already in FIG. 3, fiber 58 with grating is held under tension as support member 66, already attached at end to one end of support member 60 at 68, is attached at its other end to fiber 58 at 70 and support member 60 is attached at its other end to fiber 58 at 55, these set points 55 and 70 bridging grating 54. Support member 60, however, includes a front extension 92 which supports focusing lens 22B and to which is attached a housing 94 for supporting gain element 96 in optical alignment with input end 52 of fiber 58. Housing also supports the other lens 22A of the optical input system which collimates the light output from gain element 94. In setup, support members 60 and 66 are attached at 68 and then support member is attached at end 92 at 55 to fiber 58. This is followed by mounting of lens 22B in end 92 and attachment of housing 94 with its mounted gain element 96 and lens 22A to support member end 92 at 98. Then, fiber is held under tension from its end at fiber sheath 67 and the laser cavity output is monitored at the output end of fiber 58 and the tension on fiber is changed until a desired longitudinal mode of operation is observed in the laser output after which the tension is held and is preset by final attachment of support member 66 to fiber 58 at set point 70. Thus, mode hop suppression is achieved in the operation of the fiber DBR laser source since substantial changes in optical path length of the DBR laser cavity are thermally compensated for by easing of the preset tension on fiber 58 as the operational temperature increases (or visa versa) in a manner that takes into consideration changes in optical path length of the entire resonant cavity according to the foregoing equations including $n_g L_g$ for gain element 96 and spacing length $L_s$ as well as the fiber portion between set points 55 and 70, i.e., compensator is changing the preset tension on fiber 58 in a manner to match changes in the entire optical path length of the fiber DBR laser source to maintain a preset or desired longitudinal mode of operation so that any possibility of mode hopping with operational temperature changes is suppressed.

Although the invention has been described in conjunction with one or more preferred embodiments, it will be apparent to those skilled in the art that other alternatives, variations and modifications will be apparent in light of the foregoing description as within the spirit, context and scope of the invention. Thus, the invention described herein is intended to embrace all such alternatives, variations and modifications that may fall within the spirit and scope of the following claims.

What is claimed is:

1. A thermally compensated compound cavity comprising:
    a gain element having an optical active cavity segment as part of a resonant cavity for producing light and a first reflecting means at some point along said cavity;
    an optical waveguide spatially separate from said gain element and having an optical passive cavity segment as part of said resonant cavity, in spatial alignment with said active cavity segment and optically coupled to receive light from said gain element, said passive cavity segment including a second reflecting means;
    said active and passive cavity segments and their intercoupling spacing forming said resonant cavity between said first and second reflectors; and
    compensation means attached to a portion of said waveguide and bridging said second reflecting means and including at least portion of said passive cavity segment, said compensation means including at least two expansion support members having different rates of thermal expansion rates so that, based upon thermally induced changes occurring to said resonant cavity in cavity length and effective refractive index due to temperature variations over a temperature range, said compensation means provides for adjustment of the effective cavity length of said resonant cavity such that longitudinal mode hopping is suppressed within the temperature range.

2. The thermally compensated compound cavity of claim 1 wherein said passive cavity segment includes a Bragg grating comprising said second reflecting means.

3. The thermally compensated compound cavity of claim 2 wherein said passive cavity segment is an optical fiber waveguide.

4. The thermally compensated compound cavity of claim 2 wherein said passive cavity segment is a planar waveguide.

5. A temperature compensated waveguide DBR laser source comprising:
    a gain element providing a light output;
    an optical waveguide having an input end;
    a grating formed in said optical waveguide;
    means for coupling the light output into said waveguide input end;
    said gain element, coupling means and said waveguide to and including said grating comprising a resonant cavity for said source;
    thermal compensator attached to a portion of said waveguide bridging said grating as included in said resonant cavity and comprising at least two support members having different coefficients of thermal expansion;
    said members secured together at one of their respective ends and their other ends attached to end regions of said portion of said waveguide with said waveguide held under tension before their securing such that longitudinal mode hopping is suppressed over a broad operational temperature range.

6. The temperature compensated waveguide DBR laser source of claim 5 wherein said waveguide is an optical fiber or a planar waveguide and said gain element is a semiconductor gain element.

7. The temperature compensated waveguide DBR laser source of claim 5 wherein said thermal compensator further comprises
    three support members having different coefficients of thermal expansion, one of said support members having a low thermal expansion rate and the other two of said support members having higher thermal expansion rates;
    one end of each of said higher thermal expanding support members secured to a respective end of said low thermal expanding support member and the other ends of said of each of said higher thermal expanding support members respectively attached to end regions of said portion of said waveguide with said waveguide held under tension before their securing such that longitudinal mode hopping is suppressed and operational wavelength is stabilized over a broad operational temperature range.

8. The temperature compensated waveguide DBR laser source of claim 7 wherein said waveguide is an optical fiber or a planar waveguide.

9. A temperature compensating device for a waveguide DBR laser source for stabilized longitudinal mode operation of the laser source comprising:
    a gain element having a high reflecting rear facet and substantially antireflecting exit facet;
    an optical waveguide having an input end a spatial distance from said gain element including means for optically coupling light from said gain element via said exit facet into said input end;
    a waveguide grating having a predetermined grating period formed in said optical waveguide in close proximity to said input end forming a resonant cavity between said rear facet and said grating;
    a compensator to prevent longitudinal mode hopping between possible longitudinal modes of operation in said resonant cavity comprising:

a first element having a low coefficient of thermal expansion surrounding said optical waveguide including said waveguide grating and secured at a first end to said optical waveguide adjacent a first side of said waveguide grating; and a second element having a high coefficient of thermal expansion surrounding a portion of said optical waveguide with a first end secured to a second end of said first element and with a second end secured to said optical waveguide adjacent a second side of said waveguide grating.

10. The temperature compensating device of claim 9 wherein said optical waveguide is an optical fiber and said waveguide grating is a Bragg grating reflector in said fiber.

11. The temperature compensating device of claim 9 wherein said optical waveguide is a planar waveguide and said waveguide grating is a Bragg grating reflector formed in said planar waveguide.

12. The temperature compensating device of claim 9 wherein said gain element is a semiconductor laser diode.

13. The temperature compensating device of claim 9 wherein said first element comprises silica and said second element comprises Al.

14. The temperature compensating device of claim 9 wherein said second element has a higher coefficient of thermal expansion than said first element; said compensator adjusting said spatial distance between said gain element and said waveguide to preserve the longitudinal mode of operation of said waveguide DBR laser source upon a variation in temperature.

15. A temperature compensating device for a waveguide DBR laser source for stabilized longitudinal mode operation and the operational wavelength of the laser source comprising:

a gain element having a high reflecting rear facet and substantially antireflecting exit facet;

an optical waveguide having an input end a spatial distance from said gain element including means for optically coupling light from said gain element via said exit facet into said input end;

a waveguide grating having a predetermined grating period formed in said optical waveguide in close proximity to said input end forming a resonant cavity between said rear facet and said grating;

a compensator to prevent longitudinal mode hopping between possible longitudinal modes of operation in said resonant cavity comprising:

a first element having a low coefficient of thermal expansion surrounding said optical waveguide including said waveguide grating;

a second element having a high coefficient of thermal expansion surrounding a portion of said optical waveguide with a first end secured to a first end of said first element and with a second end secured to said optical waveguide adjacent a first side of said waveguide grating; and a third element having a high coefficient of thermal expansion surrounding a portion of said optical waveguide with a first end secured to a second end of said first element and with a second end secured to said optical waveguide adjacent a second side of said waveguide grating.

16. The temperature compensating device of claim 15 wherein said second element and third elements have higher coefficient of thermal expansion than said first element and are secured to said optical waveguide such as to place said waveguide grating under strain; said compensator upon a variation in temperature adjusting said spatial distance between said gain element and said waveguide to preserve the longitudinal mode of operation of said waveguide DBR laser source concurrently with changes in the strain on said waveguide grating to preserve the operational wavelength.

17. The temperature compensating device of claims 15 or 16 wherein said optical waveguide is an optical fiber and said waveguide grating is a Bragg grating reflector in said fiber.

18. The temperature compensating device of claims 15 or 16 wherein said optical waveguide is a planar waveguide and said waveguide grating is a Bragg grating reflector formed in said planar waveguide.

19. The temperature compensating device of claims 15 or 16 wherein said gain element is a semiconductor laser diode.

20. The temperature compensating device of claims 15 or 16 wherein said first element comprises silica and said second and third elements comprise Al, steel or a copper alloy.

\* \* \* \* \*